United States Patent
Shibano et al.

(12) 
(10) Patent No.: US 6,288,955 B1
(45) Date of Patent: Sep. 11, 2001

(54) METHODS AND SYSTEMS FOR TESTING INTEGRATED CIRCUIT MEMORY DEVICES BY OVERLAPPIING TEST RESULT LOADING AND TEST RESULT ANALYSIS

(75) Inventors: Kazuhiro Shibano, Kanagawa-ken (JP); Ki-Sang Kang, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/415,523

(22) Filed: Oct. 8, 1999

(30) Foreign Application Priority Data

Nov. 19, 1998 (JP) .................................................. 10-329100

(51) Int. Cl.$^7$ ........................................................ G11C 7/00
(52) U.S. Cl. ............................................. 365/201; 365/233
(58) Field of Search .............................. 325/189.01, 201, 325/230.01, 233

(56) References Cited

U.S. PATENT DOCUMENTS 5,627,780 * 5/1997 Machi ................................... 365/201

* cited by examiner

Primary Examiner—Terrell W. Fears
(74) Attorney, Agent, or Firm—Myers Bigel Sibley & Sajovec

(57) ABSTRACT

Integrated circuit memory devices are tested by loading into a first defect interpretation memory, results of a preceding comparison test between test pattern data that is input into a memory device and resultant data that is output from the memory device. Automatic switching then takes place to a second defect interpretation memory. The results of a succeeding comparison test are loaded therein, while simultaneously analyzing results from the preceding comparison test in the first defect interpretation memory. Then, automatic switching back to the first defect interpretation memory takes place, and results of a next succeeding comparison test are loaded therein while simultaneously analyzing the results from the succeeding comparison test in the second defect interpretation memory. Automatic switching and automatic switching back are repeatedly performed, to thereby simultaneously test a memory device and analyze memory test results.

20 Claims, 3 Drawing Sheets

METHODS AND SYSTEMS FOR TESTING INTEGRATED CIRCUIT MEMORY DEVICES BY OVERLAPPING TEST RESULT LOADING AND TEST RESULT ANALYSIS

FIELD OF THE INVENTION

This invention relates to integrated circuit memory devices, and more particularly to methods and systems for testing integrated circuit memory devices.

BACKGROUND OF THE INVENTION

Integrated circuit memory devices are widely used in consumer and commercial applications. As the integration density of integrated circuit memory devices continues to increase, more memory cells may be included in each memory device. This increase in the number of memory cells in an integrated circuit memory device can make the testing thereof more time consuming and complex.

FIG. 1 is a block diagram of a conventional integrated circuit memory device testing system (apparatus). As shown in FIG. 1, a pattern generator 4 outputs a test pattern that is written in a memory to be tested, also referred to as Device Under Test (DUT) 10. The pattern generator 4 also provides an address to designate a position for the test pattern. The pattern generator 4 also outputs a desired value pattern. The desired value pattern is provided to a logic comparator 3. The logic comparator 3 preferably comprises a digital comparator that compares the desired value pattern with the test pattern that is read from the DUT 10.

When the logic comparator 3 detects a defect resulting from failure of a comparison test, the results of the comparison test are written into a corresponding address of a defect interpretation memory 7. Accordingly, the defect interpretation memory 7 preferably contains the defect information at the address of a memory cell that has the defect. The defect interpretation memory preferably has the same memory cell structure as that of the DUT 10. A testing unit, also referred to as a testing Central Processing Unit (CPU) 9, generates control signals to control the logic comparator 3, the pattern generator 4 and the defect interpretation memory 7.

In order to test the DUT 10, a test pattern from the pattern generator 4 is written into the DUT 10 by designating an address, under control of the testing CPU 9. The test pattern is read from the DUT 10 and is provided to the logic comparator 3 along with the desired value pattern that is provided by the pattern generator. If these patterns are not identical, a defect is detected. The defect information is memorized at the corresponding address of the defect interpretation memory 7. After memorizing the defect information about the DUT 10, the testing CPU 9 interprets the defect in order to, for example, substitute redundant memory cells for defective memory cells.

Therefore, in conventional testing of integrated circuit memory devices, an integrated circuit memory device is tested in a time division manner, wherein comparison tests between test pattern data that is input into a memory and resultant data that is output from the memory are performed, the results of the comparison test are loaded into a defect interpretation memory and then the results of the comparison test are analyzed. Unfortunately, these conventional testing methods may be excessively time consuming. The testing time may be further exacerbated as the size of integrated circuit memory devices continues to increase.

SUMMARY OF THE INVENTION

It is therefore an object of the present invention to provide improved systems and methods for testing integrated circuit memory devices.

It is another object of the present invention to provide systems and methods that can increase the testing speed of integrated circuit memory devices.

These and other objects can be provided, according to the present invention, by loading results of a succeeding comparison test between test pattern data that is input into a memory device and resultant data that is output from the memory device, while simultaneously analyzing results from a preceding comparison test. It will be understood that the terms "preceding" and "succeeding" are relative terms to one another and do not require immediately preceding or immediately succeeding. Either the preceding or succeeding comparison test may be regarded as a current comparison test.

More specifically, a first defect interpretation memory is loaded with the results of a succeeding comparison test between test pattern data that is input into a memory device and resultant data that is output from the memory device. Simultaneously, results from a preceding comparison test are analyzed in a second defect interpretation memory. Subsequently, the results of the succeeding comparison test can be analyzed in the first defect interpretation memory while simultaneously loading the results of a next succeeding comparison test in the second defect interpretation memory.

The loading and simultaneous analysis may be performed under control of a testing unit, and the analyzing may take place in a defect interpreting unit. The first and second defect interpretation memories may be separate memories or may comprise respective first and second portions of a defect interpretation memory. The defect interpretation unit and the testing unit may be separate units or may comprise respective first and second portions of a processing unit.

Parallel testing methods and systems of the present invention can test integrated circuit memory devices more rapidly than conventional serial testing. In particular, conventional systems generally load results of a comparison test between test pattern data that is input into a memory device and resultant data that is output from the memory device, into a defect interpretation memory. Then, the results were read from the defect interpretation memory and interpreted afterwards. Accordingly, testing and defect interpreting were performed serially in a time division process.

This time division process may consume excessive time because the comparison test first is performed and the results are stored in a defect interpretation memory. Then, the defect can be interpreted by a testing CPU. As the integration density of integrated circuit memories continues to increase, longer times may be used to test the memory using conventional time division methods. In sharp contrast, the present invention can simultaneously load results of a succeeding comparison test while analyzing results from a preceding comparison test. Accordingly, these processes may take place in parallel, to allow reduced time for testing.

More specifically, according to the present invention, integrated circuit memory devices are tested by loading into a first defect interpretation memory, results of a preceding comparison test between test pattern data that is input into a memory device and resultant data that is output from the memory device. Automatic switching then takes place to a second defect interpretation memory. The results of a succeeding comparison test are loaded therein, while simultaneously analyzing results from the preceding comparison test in the first defect interpretation memory. Then, automatic switching back to the first defect interpretation memory takes place, and results of a next succeeding comparison test are loaded therein while simultaneously analyzing the results from the succeeding comparison test in the second defect interpretation memory. Automatic switching and automatic switching back are repeatedly performed, to thereby simultaneously test a memory device and analyze memory test results.

When automatically switching to a second defect interpretation memory and loading therein results of a succeeding comparison test, the first defect interpretation memory may be automatically connected to a defect interpreting unit, to simultaneously analyze the results from the preceding comparison test in the first defect interpretation memory. Moreover, when automatically switching back to the first defect interpretation memory and loading therein results of a next succeeding comparison test, the second defect interpretation memory may be automatically connected to the defect interpreting unit, to simultaneously analyze the results from the succeeding comparison test in the second defect interpretation memory.

Thus, since two defect interpretation memories are sequentially used to test the DUT, it is possible for the first defect interpretation memory to interpret a defect that results from a previous DUT test and for a second defect interpretation memory to carry out a subsequent DUT test at the same time, and vice versa. Accordingly, the defect interpreting process can be carried out without waiting for each DUT test to end. The time for testing and defect interpretation therefore can be reduced. The time for testing the DUT in the first defect interpretation memory can include the time for all of the testing process, changing the DUT, testing the DUT and memorizing the defect information. The time for interpreting the defect information can include the time to read the defect information from the second defect interpretation memory, to interpret the defect and determining whether the defective cell can be repaired based on the result of the defect interpreting process.

Systems (apparatus) for testing integrated circuit memory devices include a pattern generator that loads test patterns into a memory device under test. A logic comparator is responsive to the pattern generator and to the memory device under test, to compare resultant test pattern data that is output from the memory device under test and the test pattern that is input to the memory device under test, to generate information concerning defects in the memory device under test. First and second defect interpretation memories are responsive to the logic comparator, to store the information concerning defects in the memory device under test. A defect interpretation unit is responsive to the first and second defect interpretation memories, to interpret the defects in the memory device under test based on the information concerning defects in the memory device under test that is stored in the first and second defect interpretation memories. A switching unit alternatingly couples the first and second defect interpretation memories to the defect interpretation unit, to thereby alternatingly interpret the defects in the memory device under test based on the information concerning defects in the memory device under test that is stored in the first and second defect interpretation memories.

A testing unit also can be provided that alternatingly enables the second and first defect interpretation memories, respectively, to store the information concerning defects in the memory device under test in synchronism with the switching unit. The first and second defect interpretation memories can comprise respective first and second portions of a defect interpretation memory, and the defect interpretation unit and the testing unit can comprise respective first and second portions of a processing unit. Accordingly, improved systems and methods for testing integrated circuit memory devices, by overlapping test result loading and test result analysis, may be obtained.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
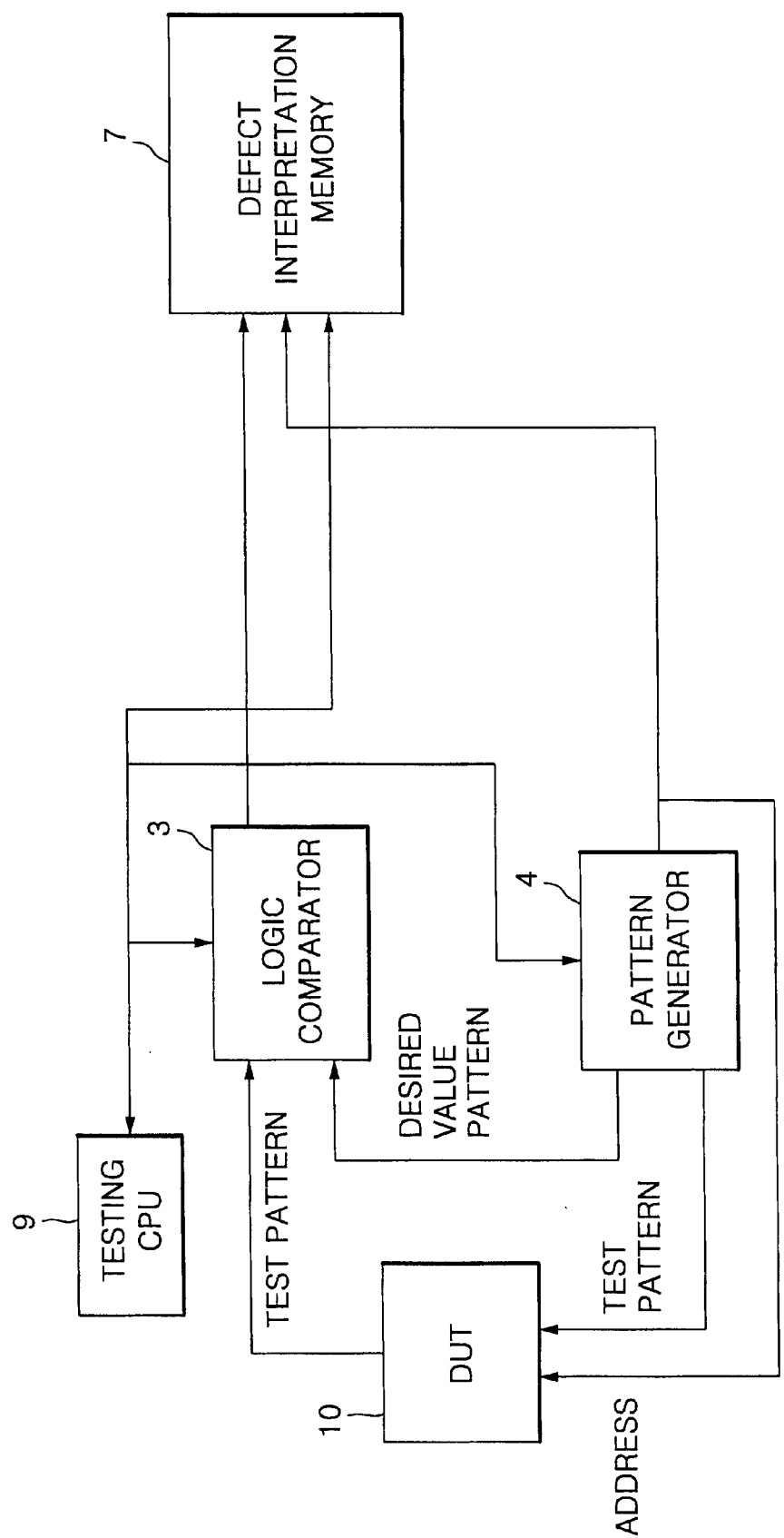
FIG. 1 is a block diagram of a conventional integrated circuit memory device testing system.
Figure 2:
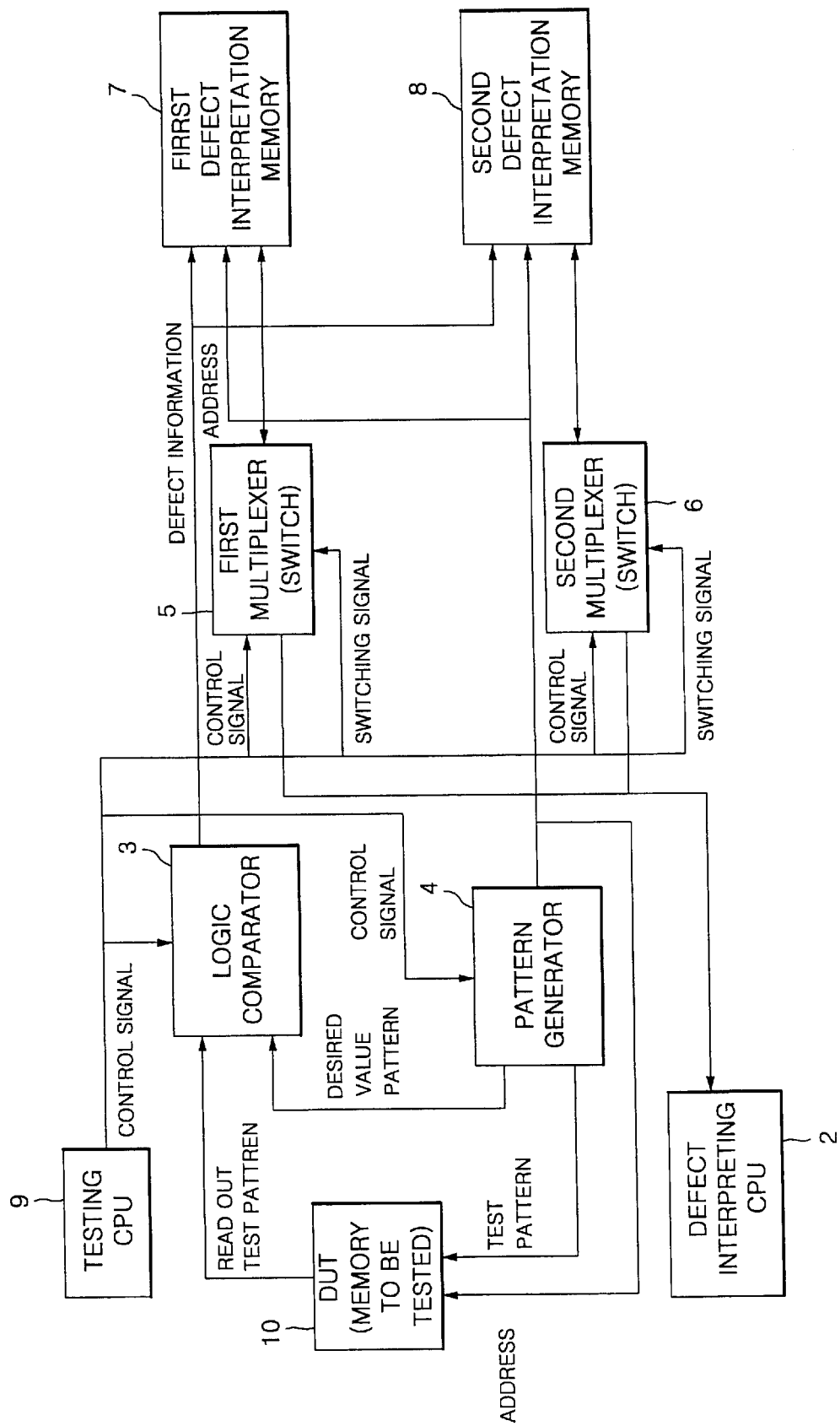
FIG. 2 is a block diagram of methods and systems for testing integrated circuit memory devices according to the present invention.

Referring now to FIG. 2, a block diagram of methods and systems (apparatus) for testing integrated circuit memory devices according to the present invention is shown. In general, compared to FIG. 1, FIG. 2 includes first and second defect interpretation memories 7 and 8 respectively, a separate testing CPU and defect interpreting CPU 9 and 2 respectively, and first and second multiplexers (switches) 5 and 6 respectively.

Referring again to FIG. 2, a testing unit (testing CPU) 9 provides a control signal to a logic comparator 3, a pattern generator 4, first and second multiplexers 5 and 6, and first and second defect interpretation memories 7 and 8, in order to control the testing. In particular, a writing control signal is transmitted to the logic comparator 3, in order to enable the logic comparator 3 to load results of a comparison test between test pattern data that is input into the DUT 10 and resultant data that is output from the DUT 10, also referred to as a read out test pattern. A control signal also is provided to the pattern generator 4, to cause the pattern generator 4 to provide a test pattern to the DUT 10, to provide a desired value pattern to the logic comparator 3, and to provide an address to the first and second defect interpretation memories 7 and 8. The testing CPU 9 also generates switching signals that are provided to the first and second multiplexers 5 and 6 respectively, to cause the multiplexers to switch over the control signal that is provided from the testing CPU 9 to the first defect interpretation memory 7, and to simultaneously switch over the storage of the defective information from the first defect interpretation memory 7 to the second defect interpretation memory 8.

The defect interpreting unit, also referred to as a defect interpreting CPU 2, reads the defect information, i.e. the results of a comparison test between test pattern data that is input into a memory device and resultant data that is output from the memory device, from the two defect interpretation memories 7 and 8 and then uses this defect information in order to interpret defects in the DUT 10. By interpreting the defect information, a determination can be made as to whether there is a defective memory cell and whether it is possible to repair the defective memory cell if the DUT includes redundancy structures. The repair of a defective memory cell using redundancy structures is well known to those having skill in the art, and need not be described further herein.

The pattern generator 4 inputs the address and the test pattern, and writes the test pattern into the position designated by the address. The same address preferably is provided to the two defect interpretation memories 7 and 8, so that the defect information can be written into the same address as that of the DUT 10.

The logic comparator 3 compares the test pattern that is read from the DUT 10 with the desired value pattern that is provided from the pattern generator 4 and determines whether they are the same. If they are not the same, the data determined as defect information is stored in one of the defect interpretation memories 7 or 8. The two defect interpretation memories 7 and 8 store the information about the positions of the defective cells, using the defect information. Accordingly, identical defect interpretation memories 7 and 8 preferably are used, that have the same capacity as the DUT 10. It will be understood that the first and second defect interpretation memories may be two separate memory devices or may be first and second portions of a single defect interpretation memory.

The first multiplexer 5 controls the input to the first defect interpretation memory. The first multiplexer 5 selects a control signal from the testing CPU 9 or a readout signal for the defect interpreting CPU 2. The second multiplexer 6 controls the input to the second defect interpretation memory 8 by selecting a readout signal for the defect interpreting CPU 2 of the second defect interpretation memory 8 or a control signal provided by the testing CPU 1.

Figure 3A:
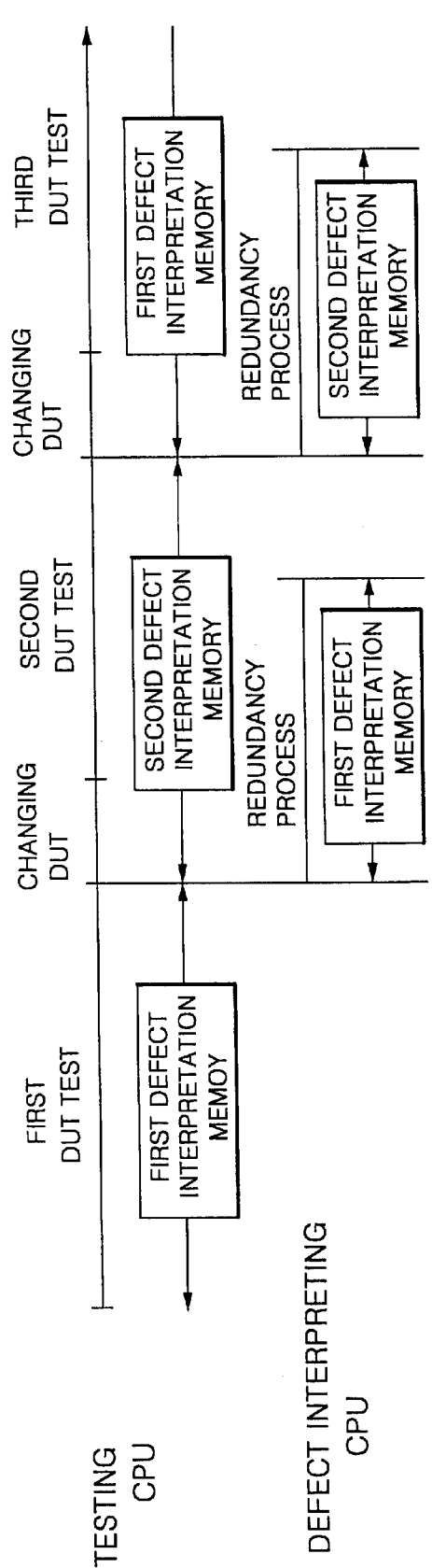
FIGS. 3A and 3B are timing charts illustrating testing of integrated circuit memory devices according to the present invention and according to conventional procedures, respectively.

Operations for testing integrated circuit memory devices according to the invention now will be described using FIGS. 2 and 3A. FIG. 3A illustrates parallel testing and defect interpreting operations. The top portion of FIG. 3A illustrates operations of the testing CPU 9. The bottom portion of FIG. 3A illustrates operations performed by the defect interpreting CPU 2.

As shown in FIG. 3A, a switching signal is transmitted from the testing CPU 9 to the multiplexers 5 and 6. The testing CPU 1 therefore is connected to the first defect interpretation memory 7 in order to write the results of the comparison test (defect information) into the first defect interpretation memory 7, while the defect interpreting CPU 2 is connected to the second defect interpretation memory 8 for reading into the defect interpreting CPU 2 the results of the comparison test (defect information) from the second defect interpretation memory 8.

In order to perform a first DUT test, the test pattern that is provided from the pattern generator 4 to the DUT 10 under control of the testing CPU 9, is written into the designated address. The test pattern read from the DUT 10 is provided to the logic comparator 3 along with the desired value pattern from the pattern generator 4. If these patterns are not the same, a defect is detected, and the defect information is written into the corresponding address of the first defect interpretation memory 7. This process may be performed on all of the memory cells of the DUT 10, thereby finishing the first test on the DUT 10.

After the end of the first test of the DUT 10 is confirmed, a switching signal is output from the testing CPU 1 to the multiplexers 5 and 6, in order to connect the testing CPU 9 to the second defect interpretation memory 8 and in order to connect the defect interpreting CPU 2 to the first defect interpretation memory 7. A first memory device to be tested then may be removed from a socket of the tester and placed into a second socket thereof. Under control of the testing CPU 1, the test pattern provided from the pattern generator is then written into the second addresses of the DUT 10, and then read out from the DUT 10 and provided to the logic comparator 3 along with the desired value pattern that is provided from the pattern generator 4.

If these patterns are different, a defect is detected, and the defect information is written into the corresponding address of the second defect interpretation memory 8. While the second test of the DUT 10 is carried out, the results (defect information) that were detected and stored in the first defect interpretation memory 7 during the first test of the DUT 10 are read into the defect interpreting CPU 2. Thus, the defects that result from the first test of the DUT 10 are interpreted in parallel. It will be understood that the present invention may be applied to multiple tests of a single integrated circuit memory device, single tests of multiple integrated circuit memory devices or combinations thereof.

Still referring to FIG. 3A, since it may take more time to test the DUT than to perform defect interpretation, the third test of the DUT 10 can start after the second test of the memory ends. In order to start the third test, the switching signals are sent from the testing CPU 1 to the multiplexers 5 and 6, so that the control signal sent from the testing CPU to the second defect interpretation memory 8 is switched back to the first defect interpretation memory 7. At the same time, the defect interpreting CPU 2 is switched back to the second defect interpreting memory 8. By repeatedly switching the defect interpretation memories 7 and 8 and the defect interpreting CPU 2 as described above, a test of a DUT of a current testing cycle and a defect interpretation of a DUT (a redundancy process) that was tested during a previous testing cycle can be performed in parallel.

Figure 3B:

Referring now to FIG. 3B, in a conventional integrated circuit memory testing method that is performed by a time division process, using a system of FIG. 1, one CPU is used for testing the DUT and for interpreting a defect in the DUT. Therefore, the testing and defect interpretation processes are carried out serially in a time division process. In contrast, according to the present invention, as shown in FIG. 3A, a second defect interpretation memory 8 can be used to store defect information concerning the DUT that was tested during the previous testing cycle and the first defect interpretation memory 7 can be used to store defect information about a DUT from a current testing cycle. The two CPUs also may be used for separate uses: the testing CPU is used to test the DUT and the defect interpreting CPU is used to interpret defects in a tested DUT. Thus, it is possible to simultaneously test a DUT and interpret a defect in a DUT that was tested during a preceding testing cycle. Accordingly, defect interpretation need not be delayed, so that the time that is used to test a DUT can be reduced compared to conventional systems and methods.

Comparing FIG. 2 to FIG. 1, systems and methods according to the invention may appear more complicated that conventional systems, due to the addition of the defect interpreting CPU 2, the second defect interpretation memory 8 and the first and second multiplexers 5 and 6. However, it will be understood by those having skill in the art that the first defect interpretation memory 7 and the second defect interpretation memory 8 actually may be first and second portions of a single defect interpretation memory. Moreover, the testing CPU and the defect interpreting CPU 2 actually may be first and second portions of a single processor. Finally, the first and second multiplexers 5 and 6 actually may be portions of a single multiplexer. Accordingly, undue complication may be avoided. When more than three CPUs are operated for simultaneous processing of testing and defect interpretation, it may be desirable to modify the system compiler. However, it may be unnecessary to modify the system compiler if two CPUs are operated for simultaneous processing of testing and defect interpretation, as shown in FIG. 2.

Accordingly, one of two defect interpretation memories is used for testing the DUT and at the same time the other defect interpretation memory is used to interpret the defect information that has been stored as a result of previous DUT testing. The total time to be taken for testing a memory device therefore may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of testing integrated circuit memory devices by performing a series of comparison tests between test pattern data that is input into a memory device and resultant data that is output from the memory device, the series of comparison tests including a preceding comparison test and a succeeding comparison test which follows the preceding comparison test, the method comprising the step of:
    loading results of the succeeding comparison test between test patter data that is input into a memory device and resultant data that is output from the memory device, while simultaneously analyzing results from the preceding comparison test.

2. A method according to claim 1 wherein the loading step comprises the step of:
    loading into a first defect interpretation memory, results of the succeeding comparison test between test pattern data that is input into a memory device and resultant data that is output from the memory device, while simultaneously analyzing the results from the preceding comparison test in a second defect interpretation memory.

3. A method according to claim 2 further comprising the step of:
    analyzing the results of the succeeding comparison test in the first defect interpretation memory, while simultaneously loading in the second defect interpretation memory the results of a next succeeding comparison test.

4. A method according to claim 2 wherein the loading step comprises the step of:
    loading into the first defect interpretation memory, the results of the succeeding comparison test between test pattern data that is input into a memory device and resultant data that is output from the memory device under control of a testing unit, while simultaneously analyzing by a defect interpreting unit, the results from the preceding comparison test in the second defect interpretation memory.

5. A method according to claim 3 wherein the analyzing step comprises the step of:
    analyzing by a defect interpreting unit, the results of the succeeding comparison test in the first defect interpretation memory, while simultaneously loading in the second defect interpretation memory the results of a next succeeding comparison test under control of a testing unit.

6. A method according to claim 5 wherein the first and second defect interpretation memories comprise respective first and second portions of a defect interpretation memory and wherein the defect interpretation unit and the testing unit comprise respective first and second portions of a processing unit.

7. A method according to claim 3:
    wherein the loading step comprises the step of loading into the first defect interpretation memory, the results of the succeeding comparison test between test pattern data that is input into a memory device and resultant data that is output from the memory device under control of a testing unit, while simultaneously analyzing by a defect interpreting unit, the results from the preceding comparison test in the second defect interpretation memory;
    wherein the analyzing step comprises the step of analyzing by the defect interpreting unit, the results of the succeeding comparison test in the first defect interpretation memory, while simultaneously loading in the second defect interpretation memory the results of a next succeeding comparison test under control of the testing unit; and
    wherein the following step is performed between the steps of loading and analyzing:
    switching the defect interpreting unit from being responsive to the second defect interpretation memory to being responsive to the first defect interpretation memory.

8. A method of testing integrated circuit memory devices by performing a series of comparison tests between test pattern data that is input into a memory device and resultant data that is output from the memory device, the series of comparison tests including a preceding comparison test and a succeeding comparison test which follows the preceding comparison test, the method comprising the steps of:
    loading into a first defect interpretation memory, results of the preceding comparison test between test pattern data that is input into a memory device and resultant data that is output from the memory device;
    automatically switching to a second defect interpretation memory and loading therein results of the succeeding comparison test while simultaneously analyzing the results from the preceding comparison test in the first defect interpretation memory;
    automatically switching back to the first defect interpretation memory and loading therein results of a next succeeding comparison test while simultaneously analyzing the results from the succeeding comparison test in the second defect interpretation memory; and
    repeatedly performing the steps of automatically switching and automatically switching back to thereby simultaneously test a memory device and analyze memory test results.

9. A method according to claim 8 wherein the step of automatically switching comprises the step of:
    automatically switching to a second defect interpretation memory and loading therein results of the succeeding comparison test while automatically connecting the first defect interpretation memory to a defect interpreting unit to simultaneously analyze the results from the preceding comparison test in the first defect interpretation memory.

10. A method according to claim 9 wherein the step of automatically switching back comprises the step of:

automatically switching back to the first defect interpretation memory and loading therein results of a next succeeding comparison test while automatically connecting the second defect interpretation memory to the defect interpreting unit to simultaneously analyze the results from the succeeding comparison test in the second defect interpretation memory.

11. A method according to claim 8 wherein the first and second defect interpretation memories comprise respective first and second portions of a defect interpretation memory.

12. A system for testing integrated circuit memory devices by performing a series of comparison tests between test pattern data that is input into a memory device and resultant data that is output from the memory device, the series of comparison tests including a preceding comparison test and a succeeding comparison test which follows the preceding comparison test, the system comprising:

first and second defect interpretation memories;

means for loading into the first defect interpretation memory, results of a preceding comparison test between test pattern data that is input into a memory device and resultant data that is output from the memory device;

means for automatically switching to the second defect interpretation memory and for loading therein results of the succeeding comparison test while simultaneously analyzing the results from the preceding comparison test in the first defect interpretation memory; and means for automatically switching back to the first defect interpretation memory and loading therein results of a next succeeding comparison test while simultaneously analyzing the results from the succeeding comparison test in the second defect interpretation memory.

13. A system according to claim 12 further comprising a defect interpreting unit, the means for automatically switching comprising:

means for automatically switching to the second defect interpretation memory and for loading therein results of the succeeding comparison test while automatically connecting the first defect interpretation memory to the defect interpreting unit to simultaneously analyze the results from the preceding comparison test in the first defect interpretation memory.

14. A system according to claim 13 wherein the means for automatically switching back comprises:

means for automatically switching back to the first defect interpretation memory and loading therein results of the next succeeding comparison test while automatically connecting the second defect interpretation memory to the defect interpreting unit to simultaneously analyze the results from the succeeding comparison test in the second defect interpretation memory.

15. A system according to claim 12 wherein the first and second defect interpretation memories comprise respective first and second portions of a defect interpretation memory.

16. A memory testing system comprising:

a pattern generator that loads test patterns into a memory device under test;

a logic comparator that is responsive to the pattern generator and to the memory device under test, to compare test pattern data that is output from the memory device under test and the test patterns, to generate information concerning defects in the memory device under test;

first and second defect interpretation memories that are responsive to the logic comparator, to store the information concerning defects in the memory device under test;

a defect interpretation unit that is responsive to the first and second defect interpretation memories to interpret the defects in the memory device under test based on the information concerning defects in the memory device under test that is stored in the first and second defect interpretation memories; and a switching unit that alternatingly couples the first and second defect interpretation memories to the defect interpretation unit to thereby alternatingly interpret the defects in the memory device under test based on the information concerning defects in the memory device under test that is stored in the first and second defect interpretation memories.

17. A memory testing system according to claim 16 further comprising a testing unit that alternatingly enables the second and first defect interpretation memories to store the information concerning defects in the memory device under test in synchronism with the switching unit.

18. A memory testing system according to claim 17 wherein the first and second defect interpretation memories comprise respective first and second portions of a defect interpretation memory and wherein the defect interpretation unit and the testing unit comprise respective first and second portions of a processing unit.

19. A memory testing system comprising:

means for loading test patterns into a memory device under test;

means for comparing test pattern data that is output from the memory device under test and the test patterns, to generate information concerning defects in the memory device under test;

first and second defect interpretation memory means for storing the information concerning defects in the memory device under test;

means for interpreting the defects in the memory device under test based on the information concerning defects in the memory device under test that is stored in the first and second defect interpretation memory means; and means for alternatingly coupling the first and second defect interpretation memory means to the means for interpreting to thereby alternatingly interpret the defects in the memory device under test based on the information concerning defects in the memory device under test that is stored in the first and second defect interpretation memory means.

20. A memory testing system according to claim 19 further comprising means for alternatingly enabling the second and first defect interpretation memory means for storing the information concerning defects in the memory device under test in synchronism with the means for alternatingly coupling the first and second defect interpretation memory means to the means for interpreting.

* * * * *

UNITED STATES PATENT AND TRADEMARK OFFICE
CERTIFICATE OF CORRECTION

PATENT NO. : 6,288,955 B1
DATED : September 11, 2001
INVENTOR(S) : Kazuhiro Shibano et al.

It is certified that error appears in the above-identified patent and that said Letters Patent is hereby corrected as shown below:

<u>Column 7,</u>
Line 33, please change "patter" to -- pattern --.

Signed and Sealed this

Thirteenth Day of July, 2004

JON W. DUDAS
*Acting Director of the United States Patent and Trademark Office*